United States Patent [19]

Ishimoto

[11] Patent Number: 4,669,064
[45] Date of Patent: May 26, 1987

[54] SEMICONDUCTOR MEMORY DEVICE WITH IMPROVED DATA WRITE FUNCTION

[75] Inventor: Shoji Ishimoto, Tokyo, Japan

[73] Assignee: NEC Corporation, Tokyo, Japan

[21] Appl. No.: 705,831

[22] Filed: Feb. 26, 1985

[30] Foreign Application Priority Data

Feb. 27, 1984 [JP] Japan .................................. 59-35530

[51] Int. Cl.[4] .............................................. G11C 7/00
[52] U.S. Cl. .................................... 365/189; 365/195
[58] Field of Search ............... 365/189, 193, 194, 195, 365/196

[56] References Cited

U.S. PATENT DOCUMENTS 4,485,461  11/1984  Kobayashi ...................... 365/193 X Primary Examiner—Joseph A. Popek
Attorney, Agent, or Firm—Sughrue, Mion, Zinn, Macpeak, and Seas

[57] ABSTRACT

A semiconductor memory device which has improved and flexible writing function of multi-bit data.

The memory has a plurality of data access circuits operable in parallel. Each of the data access circuits includes a data terminal and a data input circuit operatively storing write data applied to the data terminal. A detection circuit is connected to the data terminal, which circuit detects whether a write inhibition signal is applied to the data terminal. In response to the output of the detection circuit, a control circuit selectively disenables the data input circuit.

14 Claims, 10 Drawing Figures

SEMICONDUCTOR MEMORY DEVICE WITH IMPROVED DATA WRITE FUNCTION

BACKGROUND OF THE INVENTION

The present invention relates to a semiconductor memory device, and particularly to a memory with a plurality of data input/output terminals.

Semiconductor memories have been used extensively for digital data processing because of their large memory capacities and high speed operations. In such memories, a large number of memory cells are arranged in a matrix form of rows and columns, and usually word lines and bit lines are arrayed in rows and columns, respectively. Through a selection operation, one of the word lines is first selected so that the memory cells on the selected word lines are enabled. Thereafter, one or more cells among the enabled memory cells are selected by selectively connecting one or more digit lines to an input/output circuit or circuits. Presently, the memories with one-bit input/output structure, such as 16-K word x 1 bit, 64-K word x 1 bit, have been mainly used. However, according to the recent progress of relatively small or medium scaled data processing system such as personal computers and desk-top computers, the necessity of multi-bit output type memories having two or more input/output terminals has become remarkably increased. This is due to the fact that data of desired bit length can be obtained easily with reduced number of memories. In order to obtain a predetermined memory capacity, a plurality of multi-bit output type memories are used in parallel wherein a plurality of input/output terminals of the respective multi-bit output type memories are commonly connected to the same number of system buses in known wired-OR manner and read-write control terminals of all the memories are connected in common to a system read-write control line. In this system, however, operations with respect to the input/output terminals cannot be controlled independently. Namely, during a write cycle, write operations with respect to all the input/output terminals are simultaneously conducted even when write operations on all the input/output terminals are not necessary.

In case of image display memories (VIDEO RAM) for storing image data, which memories have become popular in video field, data processing on a bit and that on a word are simultaneously performed. When the multi-output type memory is used in such video system, data once generated from the memory are re-written thereto according to a read-modify-write cycle. However, the operation is limited to the read-modify-write cycle and unnecessary writing is also performed on one or more input/output terminals in this instance so that the power consumption is inevitably increased.

SUMMARY OF THE INVENTION

It is one object of the present invention to provide a multi-bit output type memory device wherein write operation can be conducted only on desired part of the input/output terminals.

It is another object of the present invention to provide a multi-bit output type memory having improved flexibility in control and being operable with a small power consumption.

The memory device according to the present invention is of the type having a plurality of memory cells, a selection circuit for selecting a predetermined number of memory cells, a predetermined number of data input/output circuits for accessing the selected memory cells, each of data access circuits including an input/output terminal and a data input circuit for operatively holding write data applied to the input/output terminals during a write period, and is featured in that a detection circuit and a control circuit are provided for each data access circuit, the detection circuit being adapted to detect whether a write inhibition signal is applied to the input/output terminal prior to the write period or at the beginning of the write period, the control circuit operatively disenabling the data input circuit when the write inhibition signal is detected.

According to the present invention, writing of data at the input/output terminal to which the write inhibition signal has been applied is inhibited while write data at other input/output terminal or terminals to which no write inhibition signal has been applied are written to the corresponding memory location or locations. Thus, selective control of writing of data to the corresponding memory locations are performed with respect to a plurality of data access circuits.

DETAILED DESCRIPTION OF THE INVENTION

In the following description, N-channel MOS field effect transistors are employed as transistors and a high level (Vcc) and a low level (GND) correspond to logic "1" and "0", respectively.

Figure 1:
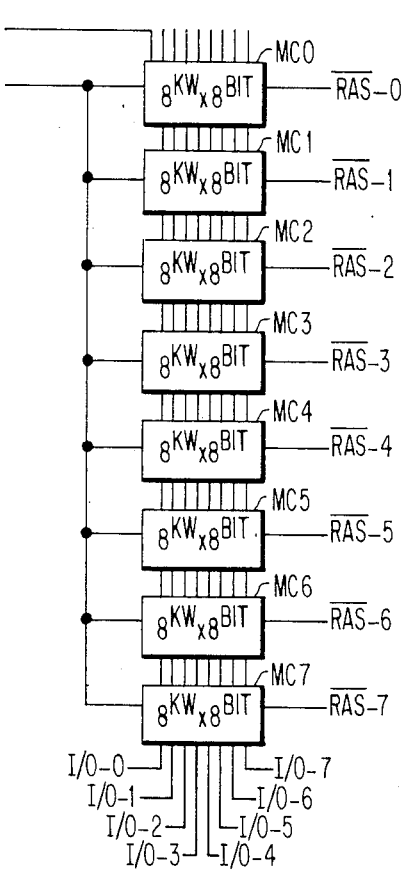
FIG. 1 is a system block diagram showing a multi-chip memory system.

First, with reference to FIG. 1, the multi-chip memory board is explained.

In this system, eight multi-bit output type memories MC0 to MC7 each having 8 KW×8 bit memory array structure and eight input/output terminals are employed with parallel connection of the respective input/output terminals to system buses I/O-0 to I/O-7 in a known wired-OR connection. A read-write control signal $\overline{WE}$, a column strobe signal CAS are commonly applied to the memories MC0 to MC7 while row strobe signals RAS-0 to RAS-1 are independently applied to the respective memories MC0 to MC7. In operation, one of RAS-0 to RAS-7 is made active and the memory receiving the activated one of RAS-0 to RAS-7 is enabled to perform memory operation through the system bus lines I/O-0 to I/O-7. In this instance, if the $\overline{WE}$ is active, the enabled memory performs write operations on all the input/output terminals simultaneously. Namely, all 8-bit of writings are always performed through the buses I/O-0 to I/O-7. In other words, data at all the input/output terminals are inevitably written to the selected word of the memory. Accordingly, it has been impossible to conduct write operation only with respect to a part of the input/output terminals with no writing with respect to the remaining other input/output terminals.

Figure 2:
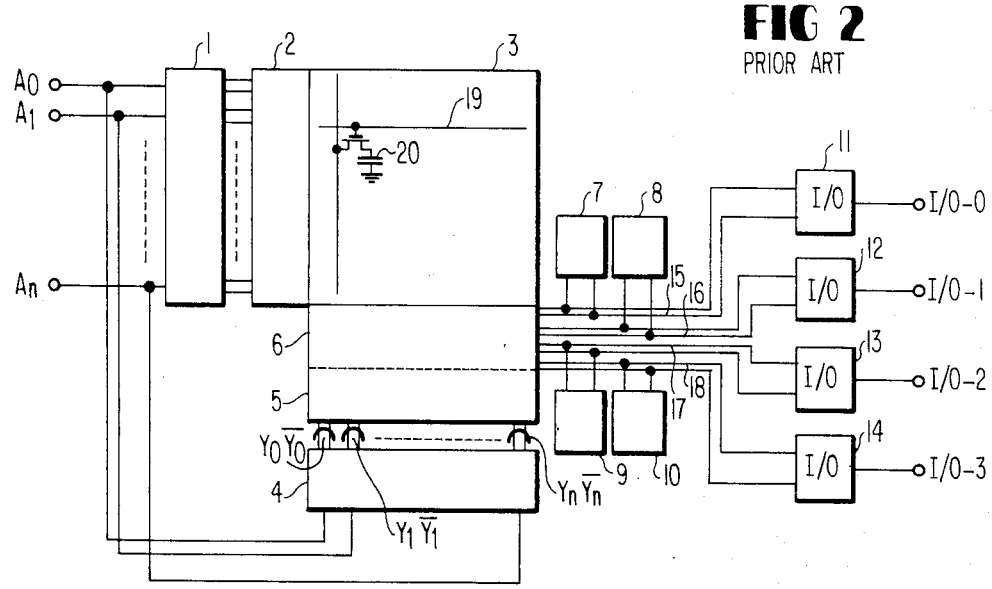
FIG. 2 is a block diagram of a memory according to prior art.

Referring to FIG. 2, one example of the multi-bit output type memory is described. Here, by way of example, the memory having 4-bit of I/O terminals I/O-0 to I/O-3 is explained, and the memory is of the type controlled by known multi-strobe type wherein row address signals and column address signals are incorporated in response to a row strobe signal $\overline{RAS}$ and column strobe signal $\overline{CAS}$, respectively, but timing circuits relating to $\overline{RAS}$ and $\overline{CAS}$ are not shown in FIG. 2.

In response to the active level of $\overline{RAS}$, a row address buffer 1 latches signals of terminals A0 to An at this time as row address signals and thereafter a row address decoder 2 selects one of word lines 19 of memory cell array so that the memory cells 20 on the selected word line generate stored data on bit lines BL and the read-out data on the bit lines are then amplified by sense amplifiers (not shown). Thereafter, a column address buffer 4 latches column address signals through the terminals Ao to An in response to the active level of $\overline{CAS}$. Then, a column address decoder 5 takes four pairs of bit lines and connects them to four pairs of bus lines 15 to 18 which are provided with data amplifiers 7 to 10 and connected to I/O buffers 11 to 14, respectively. The data amplifiers 7 to 10 are enabled in a read cycle to further amplify data on the bus line pairs 15 to 18. All the I/O buffers store data to be written in a write cycle and output data to the I/O-0 to I/O-3 in a read cycle, which cycles are controlled by a read-write control signal $\overline{WE}$.

Figure 3:
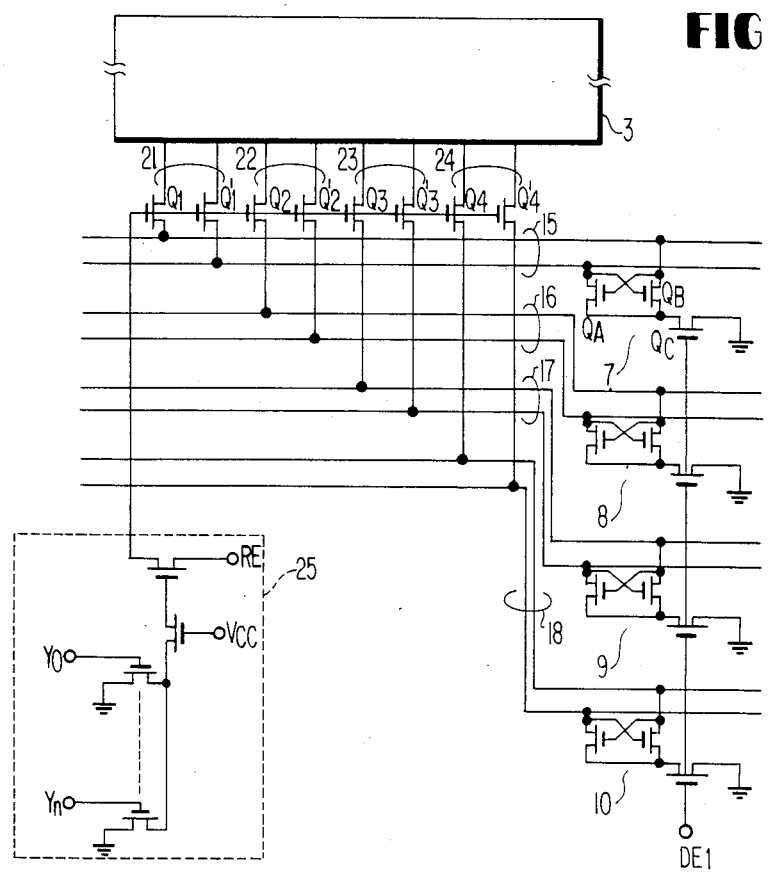
FIG. 3 is a circuit diagram showing the major part of the memory of FIG. 1.

FIG. 3 shows the column selection part with respect to one bit output of the column decoder 25 which is unit structure of the column decoder 5 and when the unit 25 is selected, transfer gate transistors ($Q_1$, $Q_1'$) to ($Q_4$, $Q_4'$) connect four pairs of bit lines associated therewith to the four pairs of bus lines 15 to 18. If another unit (not shown) of the decoder 5 is selected, other four pairs of bit lines (not shown) are connected to the bus lines through other four pairs of transfer gate transistors in a similar manner. The data amplifier 7 is composed of a pair of cross-coupled transistors $Q_A$ and $Q_B$ as illustrated. The amplifiers 7 to 10 are enabled by making a transistor $Q_C$ in response to a timimg signal DE1.

Figure 4:
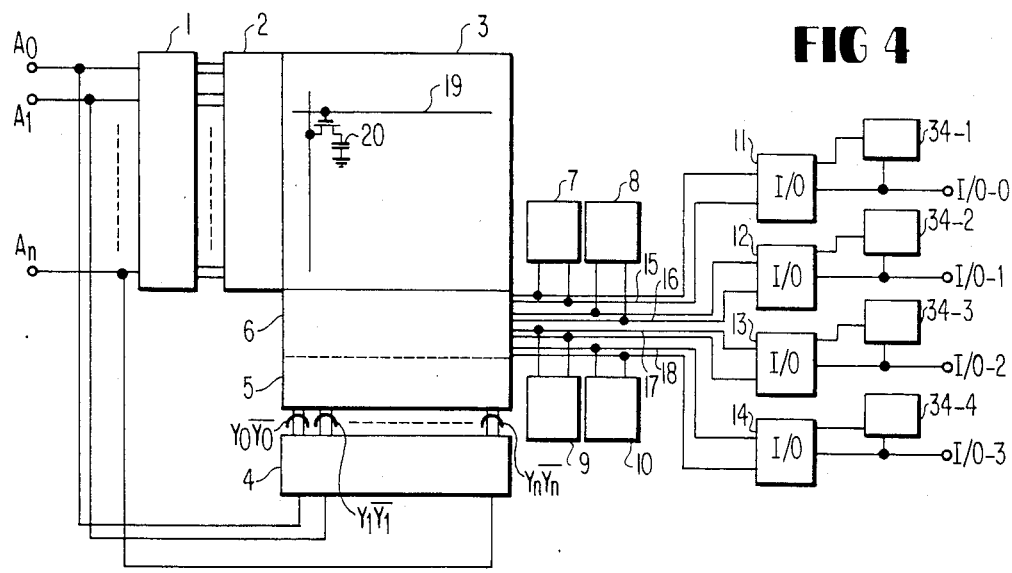
FIG. 4 is a block diagram of the memory according to the present invention.

Now referring to FIG. 4, a basic structure of the present invention is described.

In FIG. 4, the portions and elements corresponding to those in FIG. 2 are indicated by similar reference numbers.

According to the present invention, write inhibition control circuits 34-1 to 34-3 are provided to the I/O-0 to I/O-3, respectively. An input terminal of each of the circuits 34-1 to 34-4 is coupled to the corresponding I/O and an output of the same is applied to the associated I/O buffer. In this memory, the input/output terminals I/O-0 to I/O-3 are used to receive write-inhibition control signals prior to the respective read or write operation, and when the circuits 34-1 to 34-3 detect the presence of the write-inhibition signals on the associated terminals (I/O-0 to I/O-3), the circuits 34-1 to 34-3 control the I/O buffers so as not to provide data at the associated I/O terminals to the bus line pairs associated therewith even in a write cycle. Therefore, write operations with respect to the I/O buffers to which the inhibition outputs are applied from the circuits (34-1 to 34-4) are inhibited while data at the I/O terminal or terminals associated with the circuit or circuits (34-1 to 34-4) receiving no write-inhibition signal are conducted in the same write cycle. Thus, the selective write operations are performed with respect to a plurality of input/output terminals simultaneously.

Figure 5:
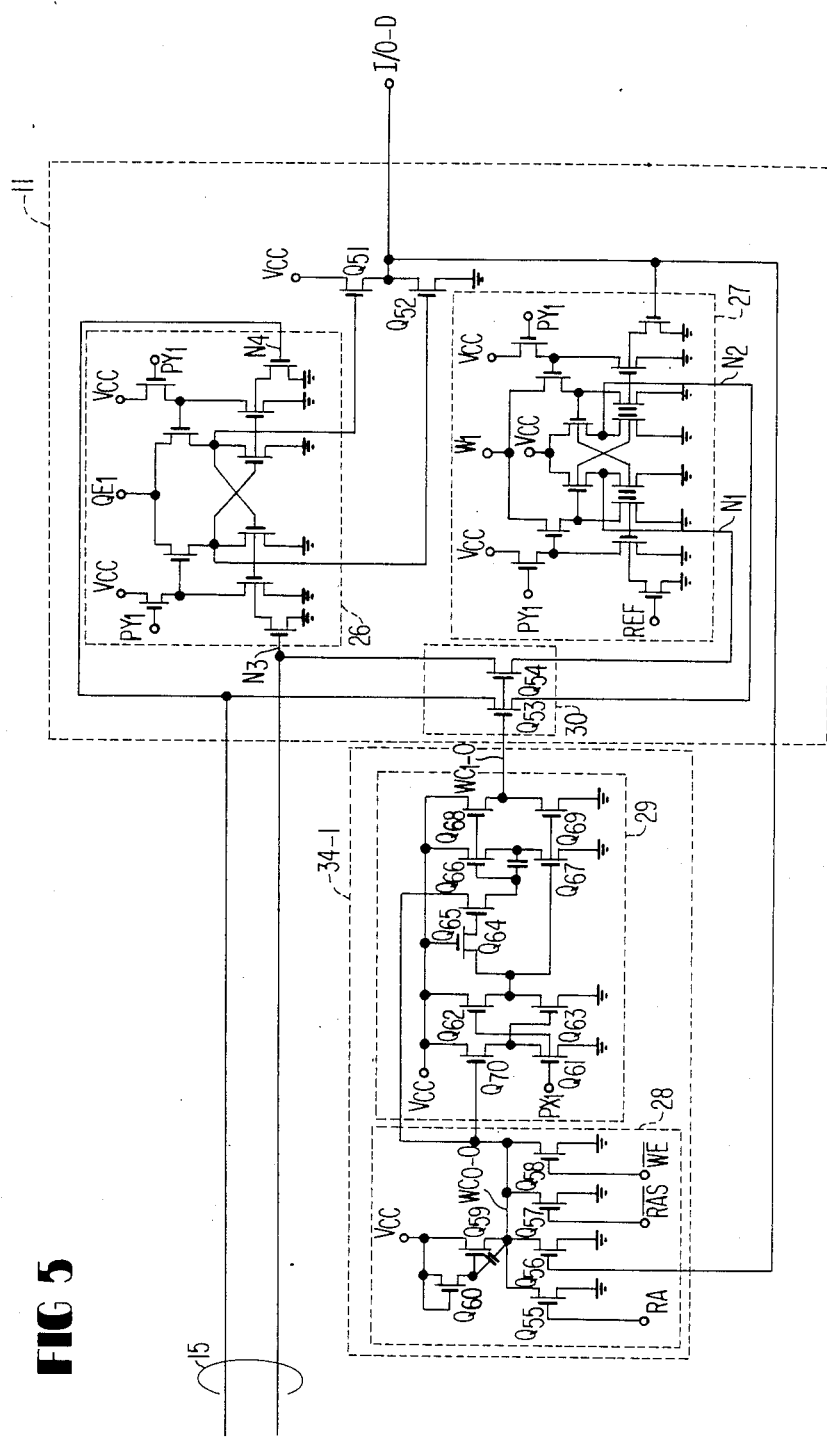
FIG. 5 is a circuit diagram showing a first embodiment of the present invention.
Figure 10:
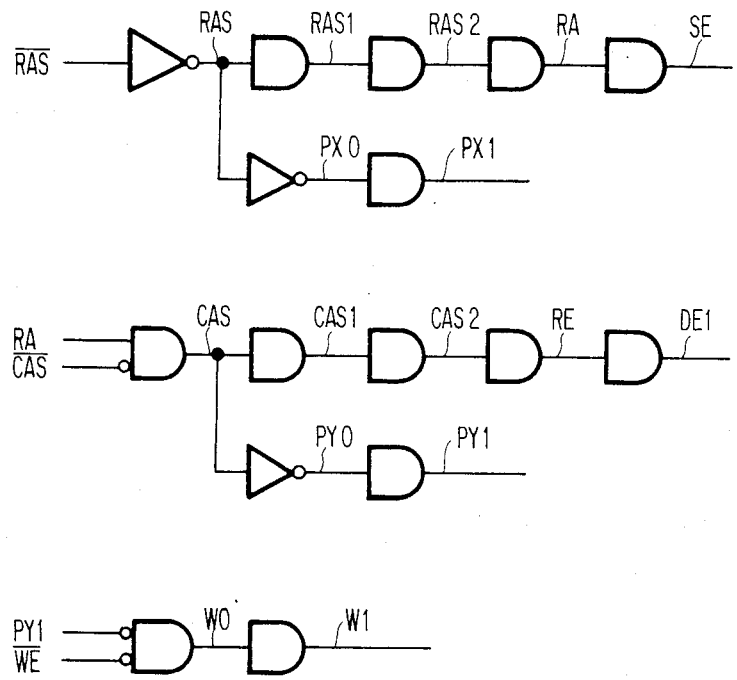
FIG. 10 is a block diagram generating timing signals employed in the present invention.

Referring to FIG. 5, a first detailed embodiment of the present invention will be described, wherein the explanation will be made with respect to the part including the circuit 34-1 and the I/O buffer 11. The write-inhibition control circuit 34-1 includes a write-inhibition signal detector circuit 28 and a buffer circuit 29. The detection circuit 28 is essentially made of a NOR gate composed of transistors $Q_{55}$ to $Q_{59}$, which gate receives a signal at the input/output terminal I/O-0, the row strobe signal $\overline{RAS}$, a write control signal $\overline{WE}$ and an internal timing signal which takes a high level a predetermined time after a change to a low level of $\overline{RAS}$. The buffer circuit 29 receives the output of the detection circuit 28 and a precharge signal PX1 which takes a high level when $\overline{RAS}$ is high. The output of the control circuit 34-1 is used to control a connection circuit 30 composed of a pair of transfer gate transistors $Q_{53}$ and $Q_{54}$ which connect a pair of output terminals $N_1$ and $N_2$ of an input buffer 27 to the pair of bus lines 15. The input buffer 27 receives the signal at the I/O-0 as its input signal and produces true and complementary signals at the terminal in response to an internal write control signal $W_1$ generated from the signal $\overline{WE}$. While an output buffer 26 of a flip-flop type has a pair of input terminals $N_3$ and $N_4$ connected to the pair of bus lines 15. The output buffer 26 is enabled in response to a timing signal DE1 which is activated with a predetermined delay with respect to the activation of the $\overline{CAS}$. A push-pull circuit composed of transistors $Q_{51}$ and $Q_{52}$ is driven by the output of the output buffer 26. The timing signals PX1, W1, PY1 and DE1 are the signals according to the timing block diagram shown in FIG. 10.

Figure 6:
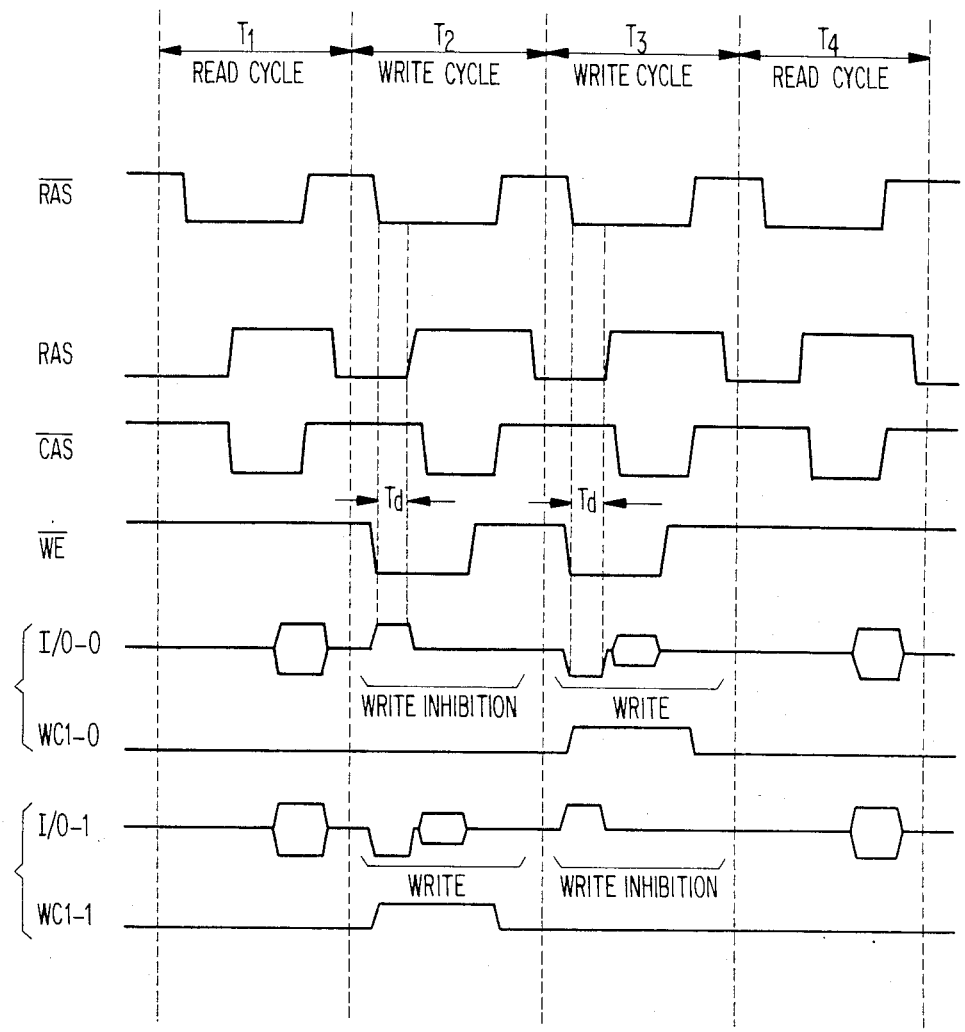
FIG. 6 is a waveform diagram showing operation of the first embodiment of the invention.

Referring to FIG. 6, operations are explained.

When a read operation is conducted, the input buffer circuit 27 and the control circuit are kept in the inactivated state because the signal W1 activating the buffer 27 is not generated and the $\overline{WE}$ is high so that the circuit 28 outputs a low level. Under this condition, the output buffer 26 amplifies the signals on the pair of bus lines to drive the push-pull circuit. Thus, the output signal is generated at the I/O-0, as illustrated as a cycle $T_1$ in FIG. 1. When a write cycle $T_2$ is introduced to the memory, the write control for the respective bus line pairs is conducted during a period Td when the $\overline{RAS}$ is at the low active level and the $\overline{CAS}$ remains the inactive high level and the $\overline{WE}$ takes the active low level. During this period Td, if a high level is applied to the input-/output terminal I/O-0 from the outside, the circuit 28 detects that the writing of the data at the I/O-0 should be inhibited through the bus line pair 15. Namely, if the high level is applied to the I/O-0 during $T_D$, the transistor $Q_{55}$ assumes the conducting state so that the circuit 28 outputs the low level. Then the buffer 29 provides a low level output $WC_{1-0}$ so that the transistors $Q_{53}$ and $Q_{54}$ are turned off thereby to cut the input buffer 27 from the bus line pair 15. Thus, even when writing of data applied to other I/O terminals such as I/O-1 is conducted, the data of I/O-0 is not written to the corresponding memory location during this write cycle $T_2$. Then, during the subsequent write cycle $T_2$, if a low level is applied to the I/O-0 during the detection period Td, the detection circuit 28 generates the high level output and the transistors $Q_{53}$ and $Q_{54}$ are made conductive. Thus, the input buffer 27 is connected to the bus line pair 15 thereby to enable writing of data applied to the I/O-0 to the bus line pair 15. Of course, during this write cycle $T_3$, writing of data at other I/O terminals such as I/O-1 can be inhibited similarly by applying the high level to the I/O-1 during the detection period Td.

Thus, by placing the detection period for sensing the level of the I/O terminal prior to the internal write operation period of the memory, the write operations based on the respective I/O terminals can be selectively and independently controlled.

Figure 7:
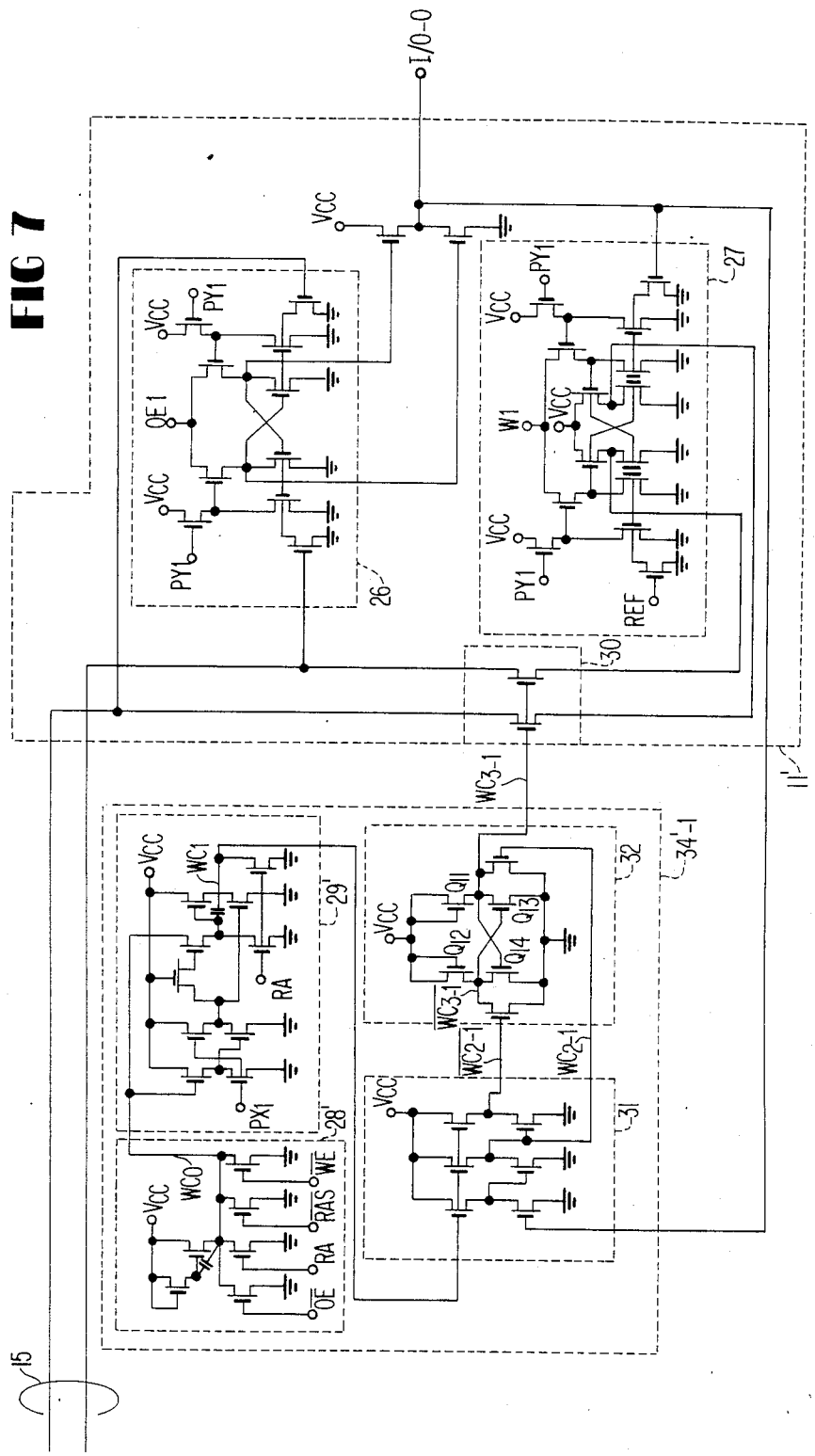
FIG. 7 is a circuit diagram showing a second embodiment of the embodiment.

Referring to FIG. 7, a second embodiment of the invention is described. In this drawing, the portions corresponding to those in FIG. 5 are designated by the similar reference numbers. In place of the circuit 34-1 of FIG. 5, a write inhibition control circuit 34'-1 is employed in this embodiment. This control circuit 34'-1 is composed of a timing detection circuit 28' for detecting the detection period corresponding to Td of FIG. 6, a buffer circuit 29', an inhibition signal detecting the inhibition signal applied to the I/O-0 and a latch circuit 32. The circuit 28' receives an output buffer control signal $\overline{OE}$ whose inverted signal OE1 is used to enable the output buffer 26, in addition to the signals RA, $\overline{RAS}$ and $\overline{WE}$. The circuit 31 generates true and complementary signals $WC_{2-1}$ and $\overline{WC_{2-1}}$ in response to the inhibition signal applied to the I/O-0 when the output $WC_1'$ is present. The signals $WC_{2-1}$ and $WC_2$ are applied to the latch circuit 32 and held therein. The output $WC_{3-1}$ of the latch circuit 32 is applied to the connection circuit 30. According to this embodiment, once the inhibition signal applied to the I/O-0 is written to the latch circuit 32, the circuit 32 maintains this state until another state of the inhibition signal is written thereto. Therefore, it is no longer necessary to apply the inhibition signal to the I/O-0 every time a write cycle is initiated. Here, the circuits 28' and 29' are used in common for the respective circuits 31 and 32 provided in all I/O terminals.

Figure 8:
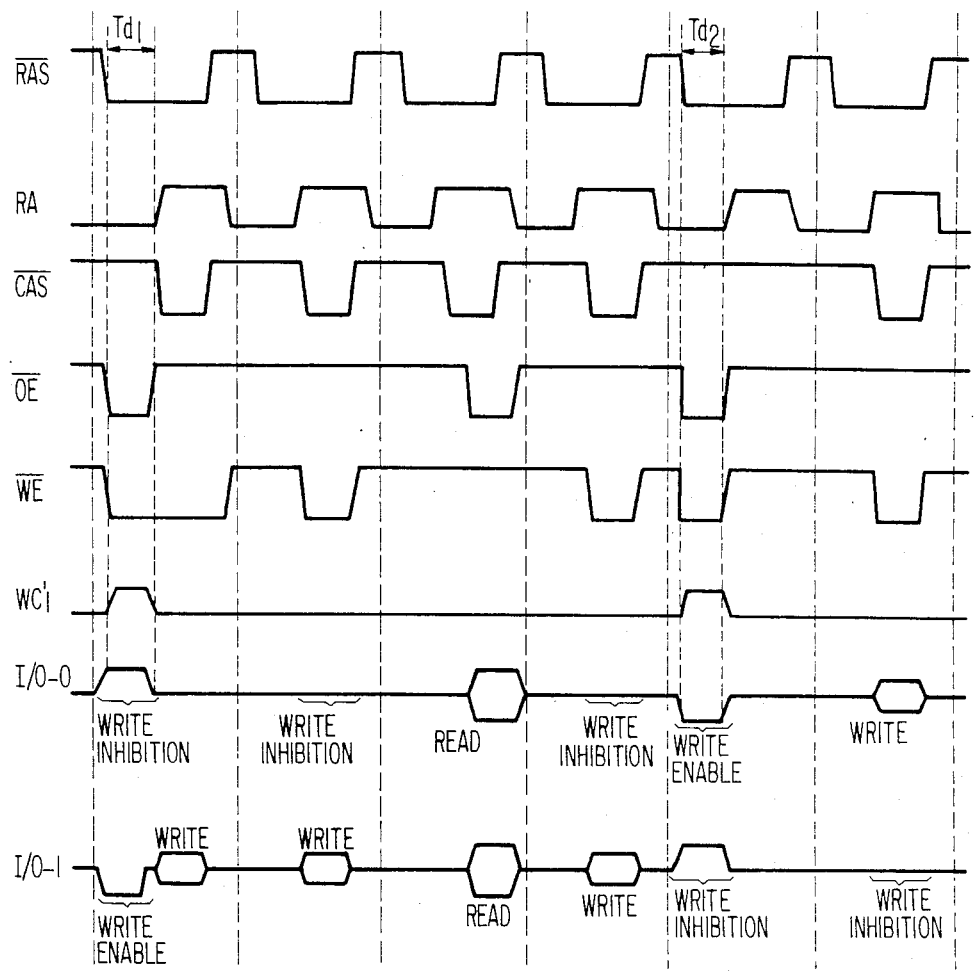
FIG. 8 is a waveform diagram showing the operations of the second embodiment of FIG. 7.

Referring to FIG. 8, operations of this embodiment is described.

In a write cycle $T_1$, $\overline{RAS}$, $\overline{WE}$ and $\overline{OE}$ change to the low active level first. In this instance, the RA still assumes a low level. Therefore, the signal $WC_1'$ assumes the high level until RA becomes high during a period $Td'_1$. During this period, if the terminal I/O-0 is set to the high level, the signal $WC_{3-1}$ assumes the low level so that the connection circuit 30 is cut off. Thus, writing of data at the I/O-0 to the bus line pair 15 is inhibited. This state of the connection circuit 30 is maintained through the subsequent write cycles $T_2$ and $T_4$ and a read cycle $T_3$. Therefore, the bus line pair 15 is separated from the input buffer 27 and writing to the bus line pair 15 is inhibited. Then, during a write cycle $T_5$, the signal $WC_1'$ assumes the high level again during a period $Td'_2$ in response to the low level of $\overline{RAS}$, RA, $\overline{OE}$ and $\overline{WE}$ so that in response to the low level applied to the I/O-0 the circuit 32 makes the connection circuit 30 conductive thereby to connect the input buffer 27 to the bus line pair 15.

Figure 9:
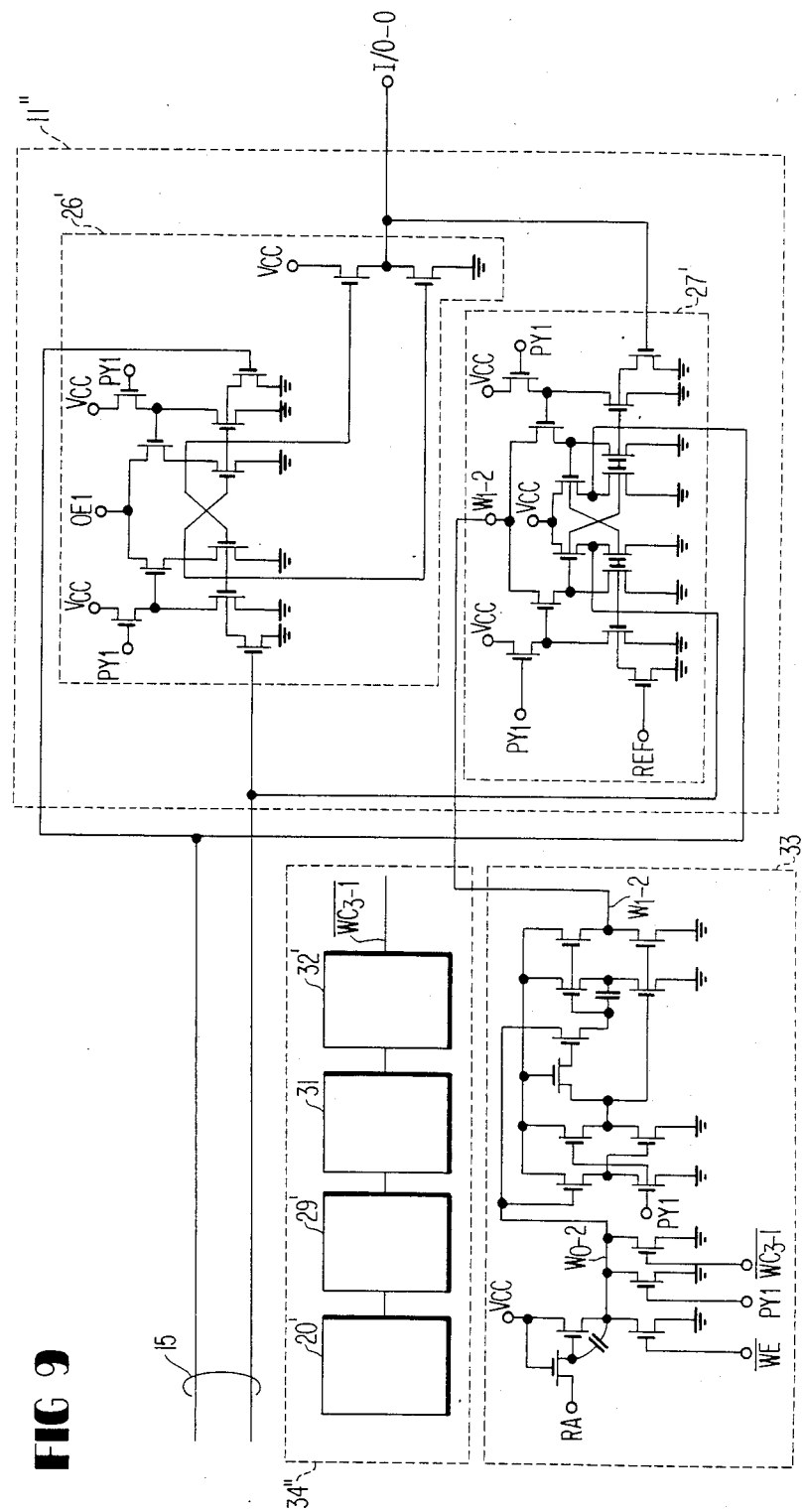
FIG. 9 is a circuit diagram showing a third embodiment of the invention.

Referring to FIG. 9, a third embodiment of the present invention now will be described. The portions corresponding to those in the previous embodiments are denoted by the similar reference numbers. In addition to the circuits 28', 29', 31 and 32 shown in FIG. 7, the control circuit 34"-1 includes a control driver circuit 33 which receives the signal $WC_{3-1}$ of the circuit 32 as well as $\overline{WE}$ and PY1 and operatively generates the output signal $W_1$-2. The output signal $W_1$-2 has the opposite phase with respect to the signal $WC_{3-1}$ and is used to enable the input buffer 27.

Therefore, if the write inhibition signal applied to the I/O-1 is not detected, the signal $W_1$-2 assumes the high level thereby to enable the buffer 27'. Thus, writing to the bus line pair 15 is allowed.

On the contrary, if the write inhibition signal is detected, the signal $W_1$-2 assumes the low level so that the buffer 27' is inhibited from generating a pair of output signals. Thus, the writing to the bus line pair 15 is inhibited.

Although the present invention has been described by way of the disclosed embodiments, it is apparent that the present invention is not limited to the embodiments but rather is applicable to many kinds of memory devices.

I claim:

1. A semiconductor memory device comprising a plurality of memory cells arranged in a matrix form of rows and columns, means for selecting said rows, a plurality of bus lines, means for operatively providing electric paths between said bus lines and the same number of columns, a plurality of data input terminals, a plurality of data input circuits each having an input end coupled to each one of said data input terminals, and an output end operatively coupled to each one of said bus lines, a plurality of control circuits each coupled to each one of said data input terminals, each of said control circuits detecting whether a write inhibition signal is applied to the associated data input terminal and disconnecting the output end of the associated data input circuit from the associated bus line when said write inhibition signal is detected.

2. The memory device according to claim 1, wherein each of said data input circuits includes a flip-flop circuit having an input terminal and an output terminal, means for coupling said input and output terminals of said flip-flop circuit to the input and output ends of said data input circuit, a transfer gate coupled between said output end of said data input circuit and said data bus.

3. The memory device according to claim 1, further comprising a plurality of data output circuits each coupled between each one of said bus lines and each of said data terminals to operatively amplify data on the associated bus line to output the amplified data to the associated data terminal.

4. The memory device according to claim 1, wherein each of said data input circuits includes a flip-flop circuit having an input end coupled to the input end of said data input terminal and an output end coupled to the output end of said data input circuit and means coupled to said flip-flop circuit and the associated control circuit for operatively enabling said flip-flop circuit when the associated control circuit does not detect said write inhibition signal.

5. The memory device according to claim 1, wherein said control circuit detects the write inhibition signal at the beginning of said write cycle.

6. A semiconductor memory device comprising a plurality of memory cells arranged in rows and columns, means for selecting one of said rows in response to row address signals, a plurality of bus lines, means for selectively coupling said bus lines to the same number of columns respectively in response to column address signals, a plurality of data terminals, a plurality of data holding means each having an input end coupled to each one of said data terminals and an output end coupled to each one of said bus lines, each of said data holding means operatively holding, at the output end thereof, data supplied through the associated data terminal in a write cycle, a plurality of detection means provided for said data terminals, each of said detection means detecting whether a write inhibition signal is applied to the associated data terminal at the beginning of said write cycle, a plurality of control means provided for said plurality of data holding means, each of said control means disenabling the associated data holding means when the associated detection means detects the write inhibition signal applied to the associated data terminal, wherein data held only by the non-inhibited data holding means are written into ones of said memory cells in said write cycle.

7. The memory device according to claim 6, wherein said row address signals and column address signals are taken into the memory through the same set of address terminals in response to a row address strobe signal and a column address strobe signal, respectively.

8. The memory device according to claim 6, wherein each of said data holding means includes a flip-flop having an input terminal coupled to the associated data terminal and an output terminal, and a transfer gate coupled between said output terminal of said flip-flop and the associated bus line.

9. A semiconductor memory device comprising a memory cell array including a plurality of memory cells arranged in rows and columns, first means for selecting one of said rows, second means for selecting a predetermined number of columns to be accessed among said columns, and a predetermined number of data access circuits for accessing said selected columns, each of said data access circuits including a data terminal, a bus line, a data generating circuit having an input end coupled to said data terminal of the same access circuit and an output end coupled to said bus line of the same access circuit, said data generating circuit operatively generating at the output end write data in response to a signal applied to its input end unless said data generating circuit is disabled during a write period, a detection circuit coupled to said data terminal for detecting that a write inhibition signal is applied to said data terminal, and a control circuit for disenabling said data generating circuit when said write inhibition signal is detected.

10. The memory device according to claim 9, wherein said data generating circuit includes a latch circuit for operatively holding data at said data terminal and a transfer gate coupled between said bus line and the output of said latch circuit, said transfer gate being controlled by said control circuit.

11. The memory device according to claim 9, wherein said access circuit further includes a data output circuit for operatively amplifying data at said bus line.

12. A semiconductor memory comprising a plurality of row lines, a plurality of column lines, a plurality of memory cells coupled to said row lines and column lines, row selection means responsive to row address information for selecting one of said row lines, first and second data lines, first and second data terminals, column selection means responsive to column address information for selectively connecting said first and second data lines to respective ones of said column lines, first and second buffer circuits each having an input end and an output end, means for connecting the input end of said first buffer circuit to said first data terminal, means for connecting the input end of said second buffer circuit to said second data terminal, each of said first and second buffer circuits operatively generating a data signal at its output end in accordance with a signal at its input end in a write mode, first coupling means coupled between said first data line and the output end of said first buffer circuit for operatively establishing a single path therebetween, second coupling means coupled between said second data line and the output end of said second buffer circuit for operatively establishing a signal path therebetween, first control means coupled to said first data terminal and said first coupling means, second control means coupled to said second data line and said second coupling means, each of said first and second control means being responsive to a predetermined potential at each one of said first and second data terminals during a first period in the write mode for selectively enabling each one of said first and second coupling means during a subsequent second period in the write mode, and means for enabling said first and second buffer circuits at least during said second period.

13. The memory according to claim 12, in which each of said first and second buffer circuits includes a flip-flop circuit.

14. The memory according to claim 12, in which each of said first and second coupling means includes a transfer gate field effect transistor.

* * * * *

UNITED STATES PATENT AND TRADEMARK OFFICE
CERTIFICATE OF CORRECTION

PATENT NO. : 4,669,064

DATED : May 26, 1987

INVENTOR(S) : ISHIMOTO

It is certified that error appears in the above-identified patent and that said Letters Patent is hereby corrected as shown below:

COLUMN 6, LINE 11   Delete "I/O-1" insert --I/O-0--

Signed and Sealed this

Twenty-third Day of August, 1988

Attest:

DONALD J. QUIGG

*Attesting Officer*   *Commissioner of Patents and Trademarks*